(12) United States Patent
Kamei

(10) Patent No.: US 12,339,593 B2
(45) Date of Patent: Jun. 24, 2025

(54) DEVELOPING METHOD AND SUBSTRATE TREATMENT SYSTEM

(71) Applicant: Tokyo Electron Limited, Tokyo (JP)

(72) Inventor: Yuya Kamei, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 570 days.

(21) Appl. No.: 17/544,058

(22) Filed: Dec. 7, 2021

(65) Prior Publication Data

US 2022/0197159 A1    Jun. 23, 2022

(30) Foreign Application Priority Data

Dec. 17, 2020   (JP) .................................. 2020-208980

(51) Int. Cl.
*G03F 7/32*  (2006.01)
*G03F 7/00*  (2006.01)
*G03F 7/40*  (2006.01)

(52) U.S. Cl.
CPC .......... *G03F 7/70925* (2013.01); *G03F 7/325* (2013.01); *G03F 7/40* (2013.01)

(58) Field of Classification Search
CPC .......... G03F 7/325; G03F 7/2024; G03F 7/32; G03F 7/40
See application file for complete search history.

(56) References Cited

U.S. PATENT DOCUMENTS

2004/0072278 A1* 4/2004 Chou ................ B01L 3/502761
                                                                  436/63
2019/0041755 A1* 2/2019 Tanaka .................. G03F 7/0044

FOREIGN PATENT DOCUMENTS

| JP | 2006-059918 A | 3/2006 |
| JP | 2015-053459 A | 3/2015 |
| JP | 2017-147328 A | 8/2017 |
| JP | 2019-047131 A | 3/2019 |
| WO | 2020/210660 A1 | 10/2020 |

* cited by examiner

*Primary Examiner* — Daborah Chacko-Davis
(74) *Attorney, Agent, or Firm* — Posz Law Group, PLC

(57) ABSTRACT

A developing method of performing a developing treatment on a substrate includes supplying a developing solution containing an organic solvent to the substrate having a metal-containing coating film exposed into a predetermined pattern; and supplying a cleaning solution containing an organic solvent to the substrate supplied with the developing solution. The cleaning solution is lower in solubility of the metal-containing coating film than the developing solution.

8 Claims, 9 Drawing Sheets

DEVELOPING METHOD AND SUBSTRATE TREATMENT SYSTEM

CROSS REFERENCE TO RELATED APPLICATIONS

This application is based upon and claims the benefit of priority of the prior Japanese Patent Application No. 2020-208980, filed in Japan on Dec. 17, 2020, the entire contents of which are incorporated herein by reference.

TECHNICAL FIELD

This disclosure relates to a developing method and a substrate treatment system.

BACKGROUND

Japanese Laid-open Patent Publication No. 2019-047131 discloses a coating and developing method including: a step of coating a front surface of a substrate with a resist containing metal to form a resist film, and exposing the resist film; a developing step of supplying a developing solution to the front surface of the substrate to develop the resist film; and a step of forming, before the developing step, a first protective film for preventing contact with the developing solution, at least at a peripheral end surface of a peripheral portion of the substrate where the resist film is not formed, and a rear surface side peripheral portion.

SUMMARY

An aspect of this disclosure is a developing method of performing a developing treatment on a substrate, the developing method including: supplying a developing solution containing an organic solvent to the substrate having a metal-containing coating film exposed into a predetermined pattern; and supplying a cleaning solution containing an organic solvent to the substrate supplied with the developing solution, wherein the cleaning solution is lower in solubility of the metal-containing coating film than the developing solution.

DETAILED DESCRIPTION

Figure 1:
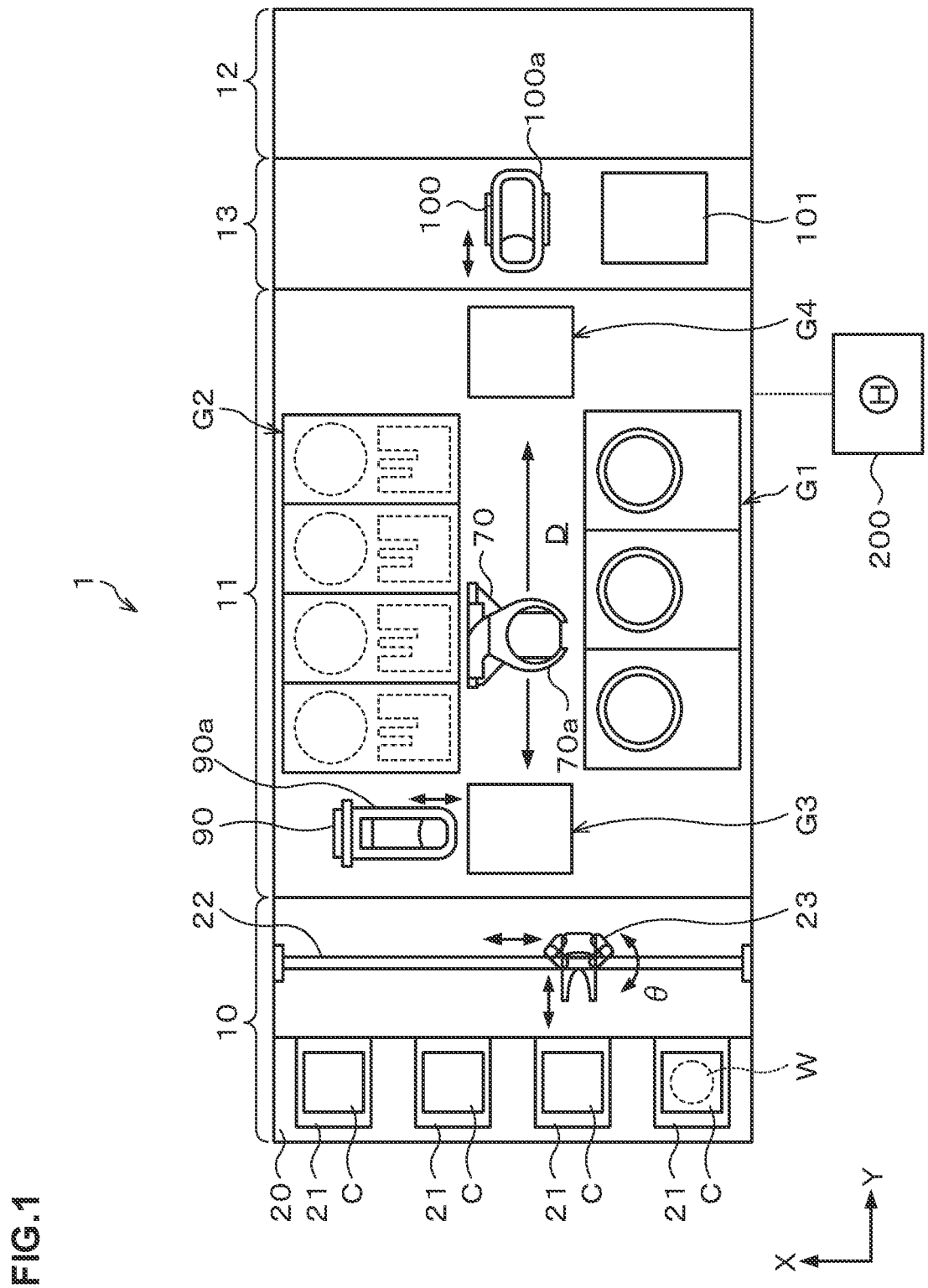
FIG. 1 is a plan view schematically illustrating the outline of a configuration of a substrate treatment system according to an embodiment.

In a manufacturing process of a semiconductor device, a photolithography step is performed which includes the formation of a resist film by resist coating on a semiconductor wafer (hereinafter, described as a "wafer"), the exposure of the resist film, and the formation of a resist pattern by developing the exposed resist film. In recent years, it is discussed to use a resist solution containing metal in order to form a finer resist pattern in the photolithography step.

However, in a developing treatment of a metal-containing resist film exposed into a predetermined pattern, a resist dissolved material which has not been sufficiently dissolved with the developing solution is likely to remain as a residue on the wafer. The residue causes a pattern defect in a subsequent etching step. In particular, in the metal-containing resist film, the polymerization reaction between metal atoms and oxygen atoms is likely to gradually proceed also at an unexposed portion at the boundary with an exposed portion, and a polymerization reaction portion hardly dissolves in the developing solution, so that the residue is likely to remain on the wafer. In the conventional developing method, it is difficult to remove the residue, and therefore it is difficult to achieve the mass production of a semiconductor using the metal-containing resist solution.

Hence, a technique according to this disclosure reduces the amount of a residue on a front surface of a substrate generated during a developing treatment of a metal-containing coating film.

Hereinafter, a developing method and a substrate treatment system for performing the developing method according to an embodiment will be explained referring to the drawings. Note that the same codes are given to components having substantially the same functions and configurations in the description and the drawings to omit duplicated explanation.

Figure 2:
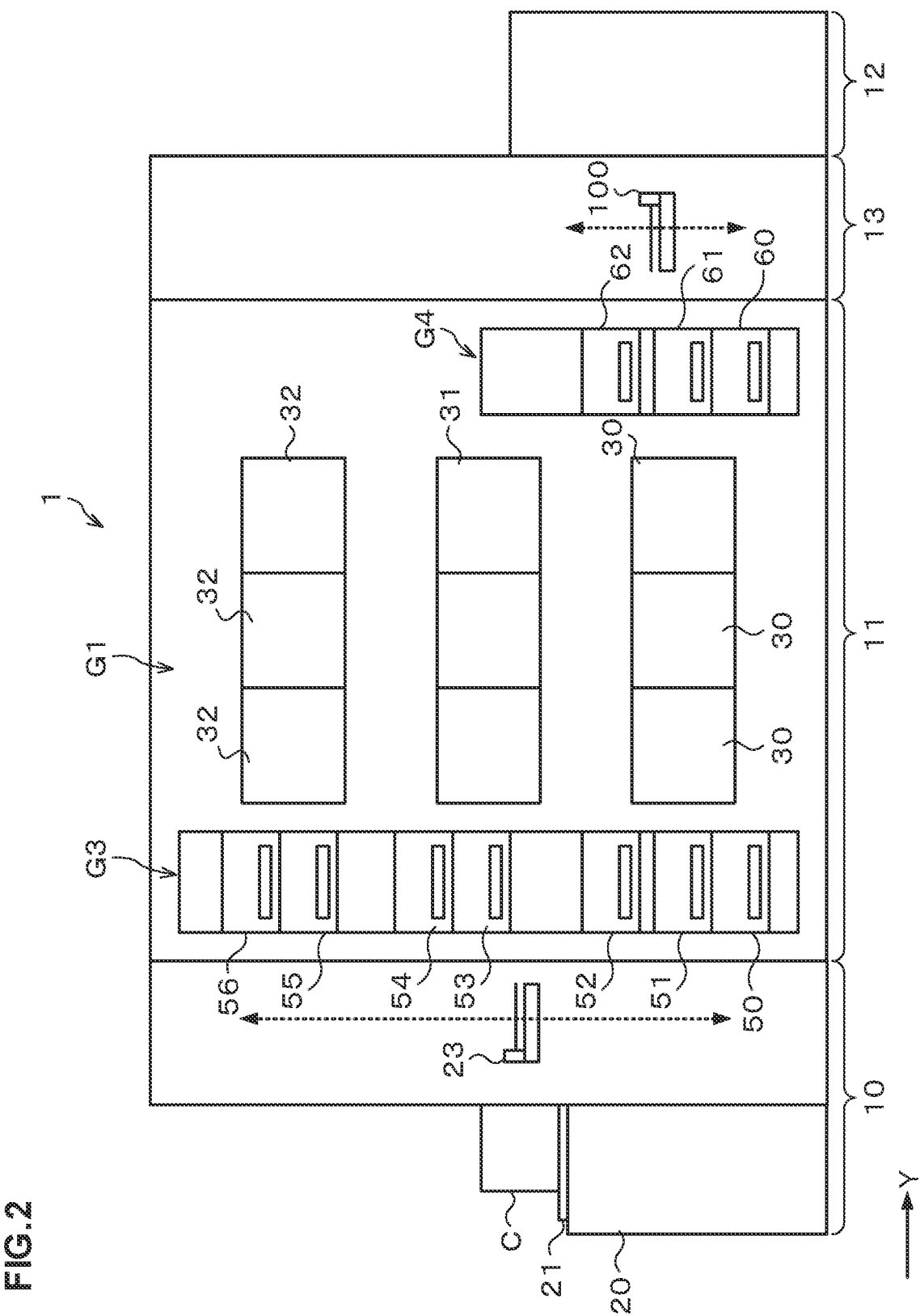
FIG. 2 is a front view schematically illustrating the outline of the configuration of the substrate treatment system in FIG. 1.
Figure 3:
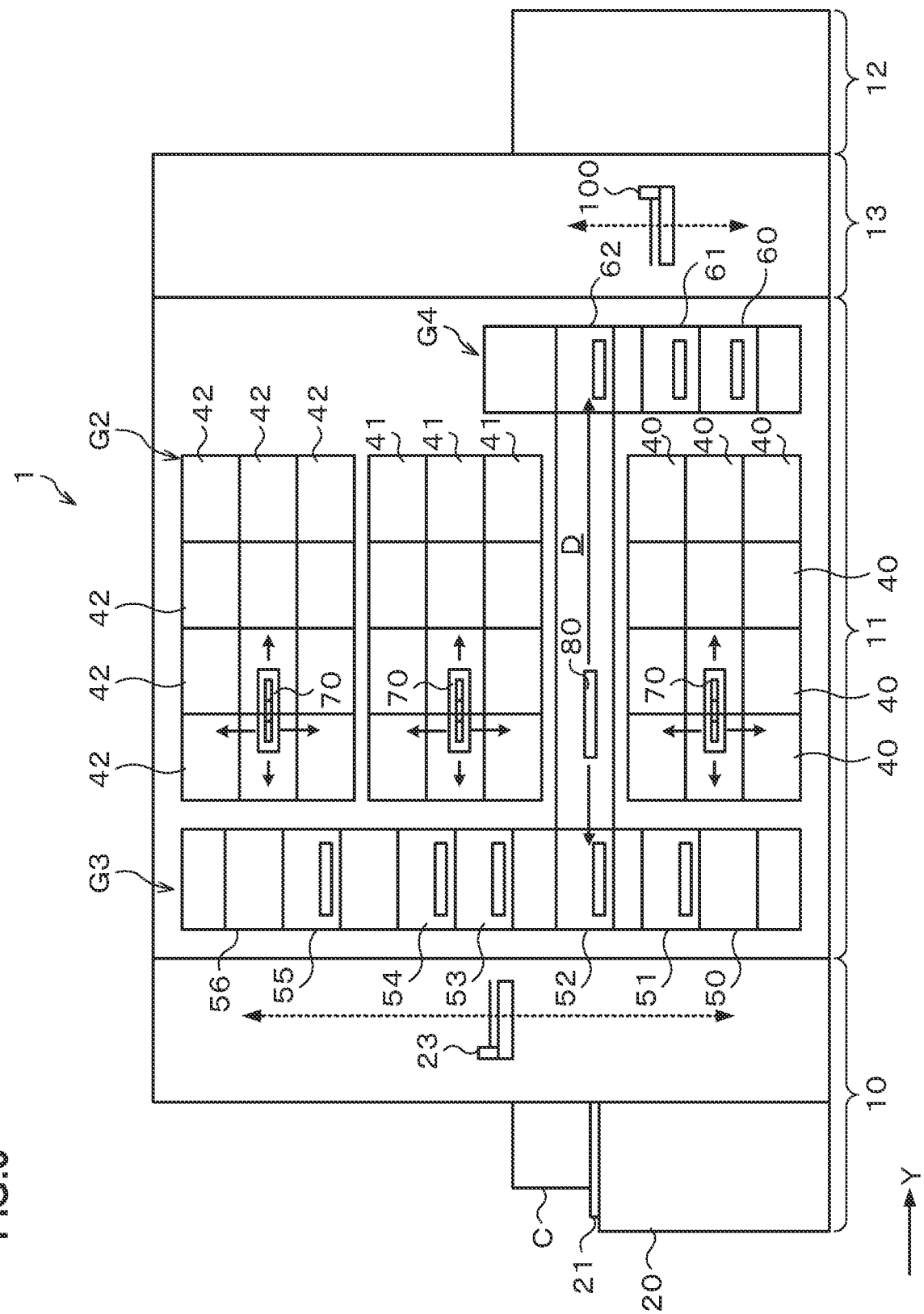
FIG. 3 is a rear view schematically illustrating the outline of the configuration of the substrate treatment system in FIG. 1.

FIG. 1 is a plan view schematically illustrating the outline of a configuration of a substrate treatment system according to an embodiment. FIG. 2 and FIG. 3 are a front view and a rear view schematically illustrating the outline of an internal configuration of the substrate treatment system 1.

The substrate treatment system 1 has, as illustrated in FIG. 1, a cassette station 10 into/out of which a cassette C housing a plurality of wafers W as substrates is transferred, and a treatment station 11 including a plurality of various treatment apparatuses which perform predetermined treatments on the wafer W. The substrate treatment system 1 has a configuration in which the cassette station 10, the treatment station 11, and an interface station 13 which performs delivery of the wafer W to/from an exposure apparatus 12 adjacent to the treatment station 11 are integrally connected.

In the cassette station 10, a cassette stage 20 is provided. On the cassette stage 20, a plurality of cassette stage plates 21 are provided on which the cassettes C are mounted when the cassettes C are transferred in/out from/to the outside of the substrate treatment system 1.

In the cassette station 10, a wafer transfer apparatus 23 is provided which is movable on a transfer path 22 extending in an X-direction in FIG. 1. The wafer transfer apparatus 23 is movable also in an up-down direction and around a vertical axis (in a θ-direction), and can transfer the wafer W between the cassette C on each of the cassette stage plates 21 and a later-explained delivery apparatus in a third block G3 in the treatment station 11.

In the treatment station 11, a plurality of, for example, four blocks G1, G2, G3, G4 each including various apparatuses are provided. For example, the first block G1 is provided on the front side (X-direction negative direction side in FIG. 1) in the treatment station 11, and the second block G2 is provided on the rear side (X-direction positive direction side in FIG. 1) in the treatment station 11. Further, the third block G3 is provided on the cassette station 10 side (Y-direction negative direction side in FIG. 1) in the treatment station 11, and the fourth block G4 is provided on the interface station 13 side (Y-direction positive direction side in FIG. 1) in the treatment station 11.

In the first block G1, a plurality of solution treatment apparatuses, for example, developing solution supply apparatuses 30, resist coating apparatuses 31, and cleaning solution supply apparatuses 32 are provided as illustrated in FIG. 2. The developing solution supply apparatus 30 performs a developing treatment on the wafer W. The resist coating apparatus 31 supplies a resist solution containing a metal (for example, Sn) as a metal-containing treatment solution to the wafer W to form a metal-containing resist film as a metal-containing coating film. The cleaning solution supply apparatus 32 supplies a cleaning solution containing an organic solvent to the wafer W to clean the wafer W. The numbers and the arrangement of the developing solution supply apparatuses 30, resist coating apparatuses 31, and cleaning solution supply apparatuses 32 can be arbitrarily selected.

In each of the developing solution supply apparatus 30, resist coating apparatus 31, and cleaning solution supply apparatus 32, for example, spin coating using a predetermined treatment solution or a coating solution is performed on the wafer W. In the spin coating, the treatment solution or the coating solution is discharged onto the wafer W, for example, from a nozzle and the wafer W is rotated to diffuse the treatment solution or the coating solution over the front surface of the wafer W.

In the second block G2, thermal treatment apparatuses 40, edge exposure apparatuses 41, and ultraviolet irradiation apparatuses 42 are provided one above the other in the up-down direction and side by side in the horizontal direction as illustrated in FIG. 3. The thermal treatment apparatus 40 performs a thermal treatment such as heating and cooling on the wafer W. The edge exposure apparatus 41 exposes the outer peripheral portion of the wafer W. The ultraviolet irradiation apparatus 42 irradiates the wafer W with ultraviolet light. The numbers and the arrangement of the thermal treatment apparatuses 40, edge exposure apparatuses 41, and ultraviolet irradiation apparatuses 42 can be arbitrarily selected.

In the third block G3, for example, a plurality of delivery apparatuses 50, 51, 52, 53, 54, 55, 56 are provided in order from the bottom. Further, in the fourth block G4, a plurality of delivery apparatuses 60, 61, 62 are provided in order from the bottom.

As illustrated in FIG. 1 and FIG. 3, in a region surrounded by the first block G1 to the fourth block G4, a wafer transfer region D is formed. In the wafer transfer region D, a wafer transfer apparatus 70 is arranged.

Each wafer transfer apparatus 70 has a transfer arm 70a movable, for example, in the Y-direction, the X-direction, the θ-direction, and the up-down direction. A plurality of the wafer transfer apparatuses 70 are arranged one above the other, and each of the wafer transfer apparatuses 70 can move in the wafer transfer region D and transfer the wafer W, for example, to a predetermined apparatus at about the same height in each of the blocks G1 to G4.

Further, in the wafer transfer region D, a shuttle transfer apparatus 80 is provided which linearly transfers the wafer W between the third block G3 and the fourth block G4.

The shuttle transfer apparatus 80 is configured to be linearly movable, for example, in the Y-direction in FIG. 3. The shuttle transfer apparatus 80 can move in the Y-direction while supporting the wafer W, and transfer the wafer W between the delivery apparatus 52 in the third block G3 and the delivery apparatus 62 in the fourth block G4.

As illustrated in FIG. 1, a wafer transfer apparatus 90 is provided adjacent to the third block G3 on the X-direction positive direction side. The wafer transfer apparatus 90 has a transfer arm 90a that is movable, for example, in the X-direction, the θ-direction, and the up-down direction. The wafer transfer apparatus 90 can move up and down while supporting the wafer W to transfer the wafer W to each of the delivery apparatuses in the third block G3.

In the interface station 13, a wafer transfer apparatus 100 and a delivery apparatus 101 are provided. The wafer transfer apparatus 100 has a transfer arm 100a that is movable, for example, in the Y-direction, the θ-direction, and the up-down direction. The wafer transfer apparatus 100 can transfer the wafer W to/from each of the delivery apparatuses in the fourth block G4, the delivery apparatus 101, and the exposure apparatus 12, for example, while supporting the wafer W by the transfer arm 100a.

The above substrate treatment system 1 is provided with a controller 200. The controller 200 is composed of a computer including, for example, a CPU, a memory and so on, and includes a program storage (not illustrated). In the program storage, programs for controlling various treatments in the substrate treatment system 1 are stored. Note that the above programs may be the ones recorded in a computer-readable storage medium H and installed from the storage medium H into the controller 200. Some or all of the programs may be realized by dedicated hardware (circuit board). The storage medium H may be either a transitory storage medium or a non-transitory storage medium.

Next, various apparatuses for performing the developing method according to the embodiment will be individually and concretely explained.

Developing Solution Supply Apparatus

Figure 4:
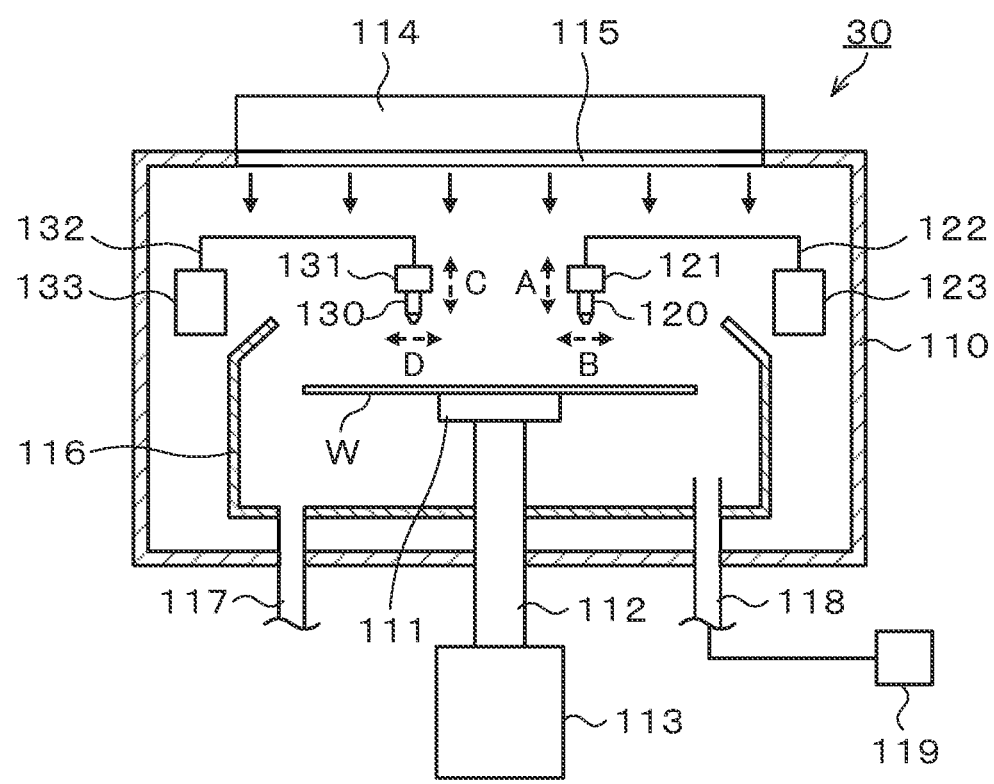
FIG. 4 is a side cross-sectional view schematically illustrating the outline of a configuration of a developing solution supply apparatus according to the embodiment.

FIG. 4 is a side cross-sectional view schematically illustrating the outline of a configuration of the developing solution supply apparatus 30 according to the embodiment. The developing solution supply apparatus 30 has a treatment container 110, and a side surface of the treatment container 110 is formed with a transfer-in/out port (not illustrated) for the wafer W. In the treatment container 110, a spin chuck 111 is provided as a substrate holder. The spin chuck 111 horizontally holds the wafer W as the substrate. The spin chuck 111 is connected to a rotor 112 which can rise and fall, and the rotor 112 is connected to a rotation driver 113 composed of a motor or the like. Accordingly, the drive of the rotation driver 113 can rotate the held wafer W.

At a ceiling portion of the treatment container 110, a filter apparatus 114 is provided, so that a downflow of cleaned air is formed in the treatment container 110 via an air supplier 115.

Outside the spin chuck 111, a cup 116 is arranged to prevent the scattering developing solution, cleaning solution, and their mists from scattering around. At a bottom of the cup 116, a drain pipe 117 and an exhaust pipe 118 are provided. The exhaust pipe 118 leads to an exhaust apparatus 119 such as an exhaust pump.

In the treatment container 110, a developing solution nozzle 120 as a developing solution supplier is arranged which discharges the developing solution toward the front surface of the wafer W. The developing solution nozzle 120 is provided on a nozzle support 121 such as an arm, and the nozzle support 121 can rise and fall by a drive mechanism (not illustrated) as indicated with a reciprocation arrow A illustrated by a broken line in the drawing and can horizontally move as indicated with a reciprocation arrow B illustrated by a broken line. To the developing solution nozzle 120, the developing solution is supplied from a developing solution supply source 123 via a supply pipe 122.

Further, in the treatment container 110, a cleaning solution nozzle 130 as a cleaning solution supplier is arranged which discharges the cleaning solution toward the front surface of the wafer W. The cleaning solution nozzle 130 is provided on a nozzle support 131 such as an arm, and the nozzle support 131 can rise and fall by a drive mechanism (not illustrated) as indicated with a reciprocation arrow C illustrated by a broken line in the drawing and can horizontally move as indicated with a reciprocation arrow D illustrated by a broken line. To the cleaning solution nozzle 130, the cleaning solution is supplied from a cleaning solution supply source 133 via a supply pipe 132.

According to the developing solution supply apparatus 30 in the embodiment, by supplying the developing solution or the cleaning solution to the center of the wafer W while rotating the wafer W, the developing solution or the cleaning solution can be diffused over the entire wafer W. However, the supply method of the developing solution or the cleaning solution is not particularly limited as long as it is a method which can supply the developing solution or the cleaning solution onto the front surface of the wafer W, so that the configuration of the developing solution supply apparatus 30 is not limited to the configuration explained in the embodiment. The apparatus configuration is appropriately changed depending on a developing method to be employed such as a puddle development or a spray development.

Cleaning Solution Supply Apparatus

Figure 5:
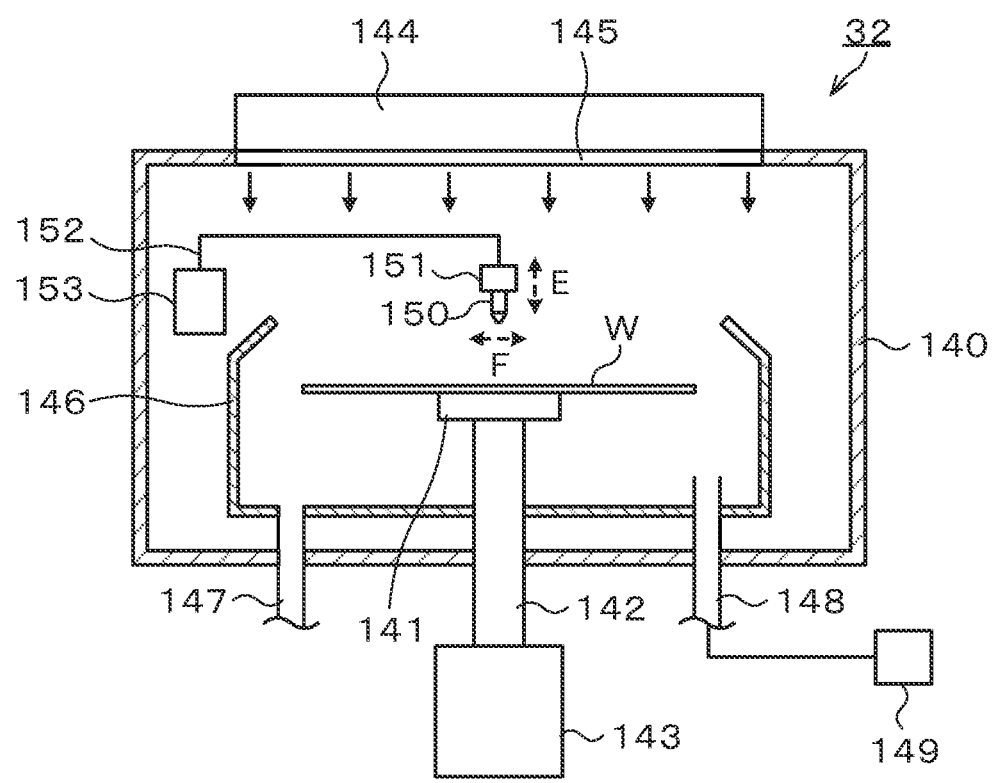
FIG. 5 is a side cross-sectional view schematically illustrating the outline of a configuration of a cleaning solution supply apparatus according to the embodiment.

FIG. 5 is a side cross-sectional view schematically illustrating the outline of a configuration of the cleaning solution supply apparatus 32 according to the embodiment. The cleaning solution supply apparatus 32 has a casing 140, and a side surface of the casing 140 is formed with a transfer-in/out port (not illustrated) for the wafer W. In the casing 140, a spin chuck 141 is provided as a substrate holder. The spin chuck 141 horizontally holds the wafer W as the substrate. The spin chuck 141 is connected to a rotor 142 which can rise and fall, and the rotor 142 is connected to a rotation driver 143 composed of a motor or the like. Accordingly, the drive of the rotation driver 143 can rotate the held wafer W.

At a ceiling portion of the casing 140, a filter apparatus 144 is provided, so that a downflow of cleaned air is formed in the casing 140 via an air supplier 145.

Outside the spin chuck 141, a cup 146 is arranged to prevent the scattering cleaning solution and its mist from scattering around. At a bottom of the cup 146, a drain pipe 147 and an exhaust pipe 148 are provided, The exhaust pipe 148 leads to an exhaust apparatus 149 such as an exhaust pump.

In the casing 140, a cleaning solution nozzle 150 as a cleaning solution supplier is arranged which discharges the cleaning solution (a later-explained pattern cleaning solution) toward the front surface of the wafer W. The cleaning solution nozzle 150 is provided on a nozzle support 151 such as an arm, and the nozzle support 151 can rise and fall by a drive mechanism (not illustrated) as indicated with a reciprocation arrow E illustrated by a broken line in the drawing and can horizontally move as indicated with a reciprocation arrow F illustrated by a broken line. To the cleaning solution nozzle 150, the cleaning solution is supplied from a cleaning solution supply source 153 via a supply pipe 152.

According to the cleaning solution supply apparatus 32 in the embodiment, by supplying the cleaning solution to the center of the wafer W while rotating the wafer W, the cleaning solution can be diffused over the entire wafer W. However, the supply method of the cleaning solution is not particularly limited as long as it is a method which can supply the cleaning solution onto the front surface of the wafer W, so that the configuration of the cleaning solution supply apparatus 32 is not limited to the configuration explained in the embodiment.

Heat Treatment Apparatus

Figure 6:
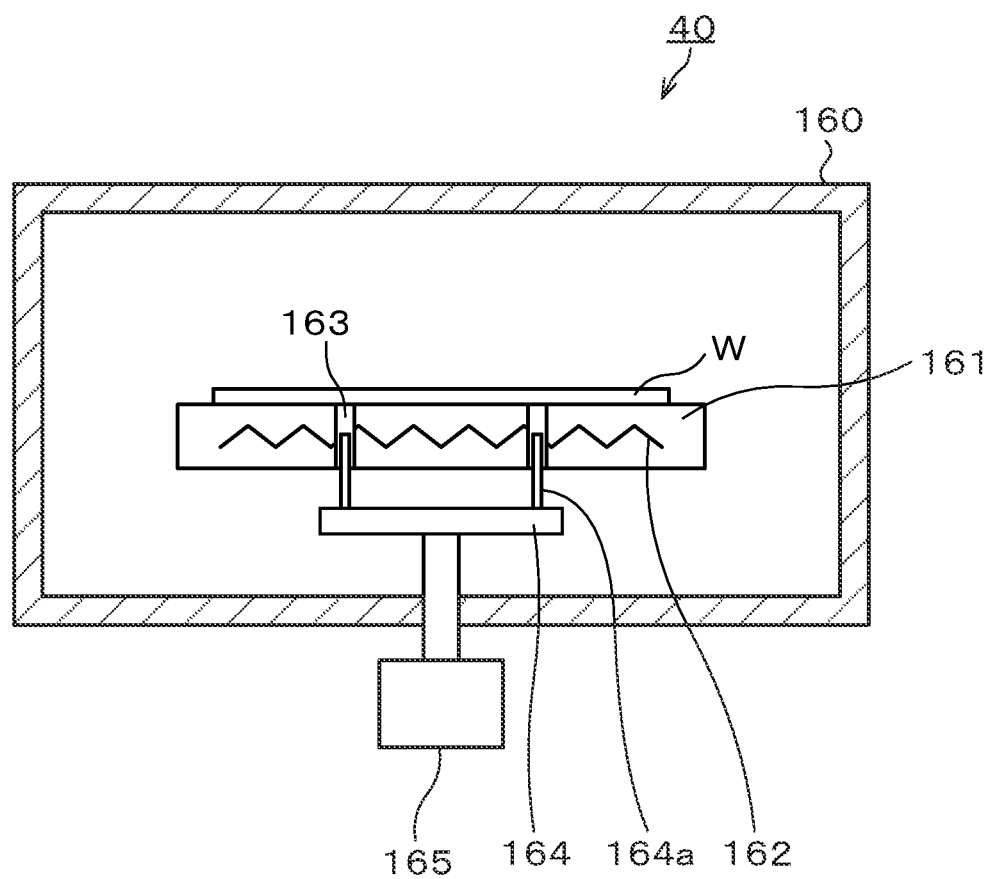
FIG. 6 is a side cross-sectional view schematically illustrating the outline of a configuration of a thermal treatment apparatus according to the embodiment.

FIG. 6 is a side cross-sectional view schematically illustrating the outline of a configuration of the thermal treatment apparatus 40 according to the embodiment. The thermal treatment apparatus 40 has a treatment container 160, and a side surface of the treatment container 160 is formed with a transfer-in/out port (not illustrated) for the wafer W. In the treatment container 160, a stage 161 is provided as a substrate holder on which the wafer W is mounted. In the stage 161, a heater 162 as a heating part for the wafer W is provided. In the stage 161, through holes 163 are formed at a plurality of locations. Rising and falling pins 164*a* rising and falling in the through holes 163 are provided on a raising and lowering pin support 164. The raising and lowering pin support 164 vertically rises and falls by a rising and falling mechanism 165.

Note that the thermal treatment apparatus 40 is not limited to the configuration explained in the embodiment but only needs to have a configuration capable of heating the wafer W.

Ultraviolet Irradiation Apparatus

Figure 7:
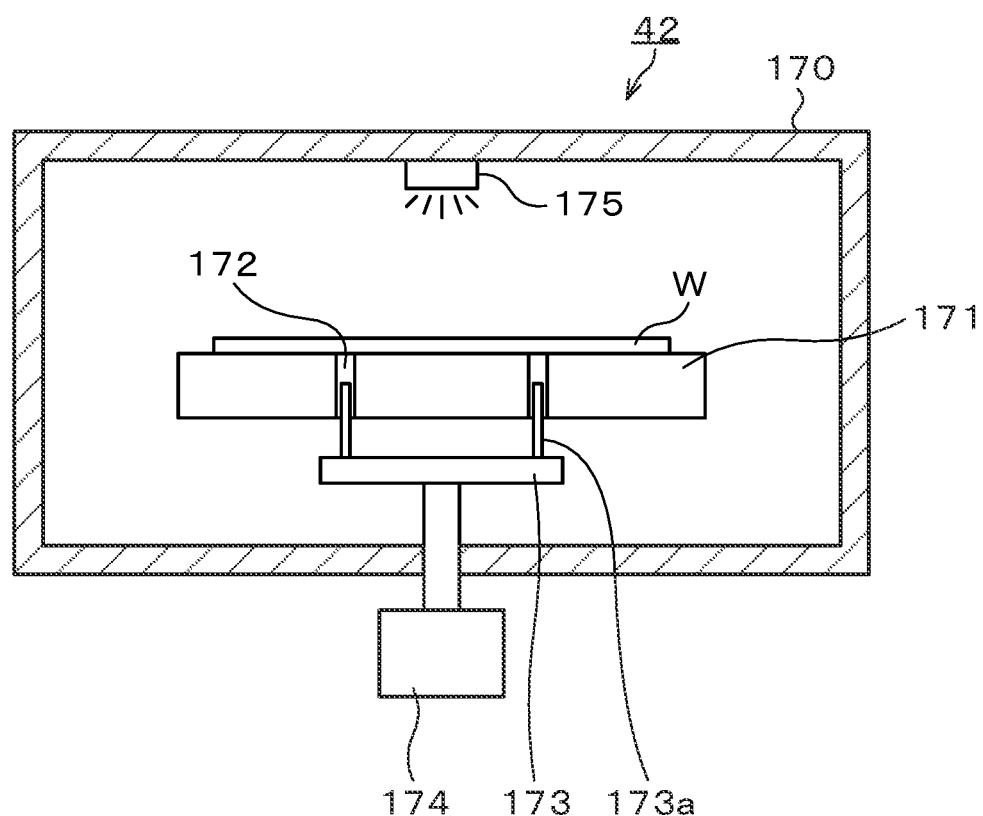
FIG. 7 is a side cross-sectional view schematically illustrating the outline of a configuration of an ultraviolet irradiation apparatus according to the embodiment.

FIG. 7 is a side cross-sectional view schematically illustrating the outline of a configuration of the ultraviolet irradiation apparatus 42 according to the embodiment. The ultraviolet irradiation apparatus 42 has a casing 170, and a side surface of the casing 170 is formed with a transfer-in/out port (not illustrated) for the wafer W. In the casing 170, a stage 171 is provided as a substrate holder on which the wafer W is mounted. In the stage 171, through holes 172 are formed at a plurality of locations. Rising and falling pins 173*a* rising and falling in the through holes 172 are provided on a raising and lowering pin support 173. The raising and lowering pin support 173 vertically rises and falls by a rising and falling mechanism 174.

Above the stage 171, a UV lamp 175 as an ultraviolet irradiator is provided which irradiates the front surface of the wafer W mounted on the stage 171 with ultraviolet light. The UV lamp 175 in the embodiment radially emits ultraviolet light having a wavelength of 190 to 400 nm. Note that the ultraviolet irradiation apparatus 42 is not limited to the configuration explained in the embodiment but only needs to have a configuration capable of irradiating the wafer W with the ultraviolet light having a wavelength of 190 to 400 nm. For the ultraviolet irradiation apparatus 42, for example, a KrF exposure apparatus at a wavelength of 248 nm is used.

The substrate treatment system 1 according to the embodiment is configured as above. Next, the developing method for the wafer W in the substrate treatment system 1 will be explained.

Figure 8:
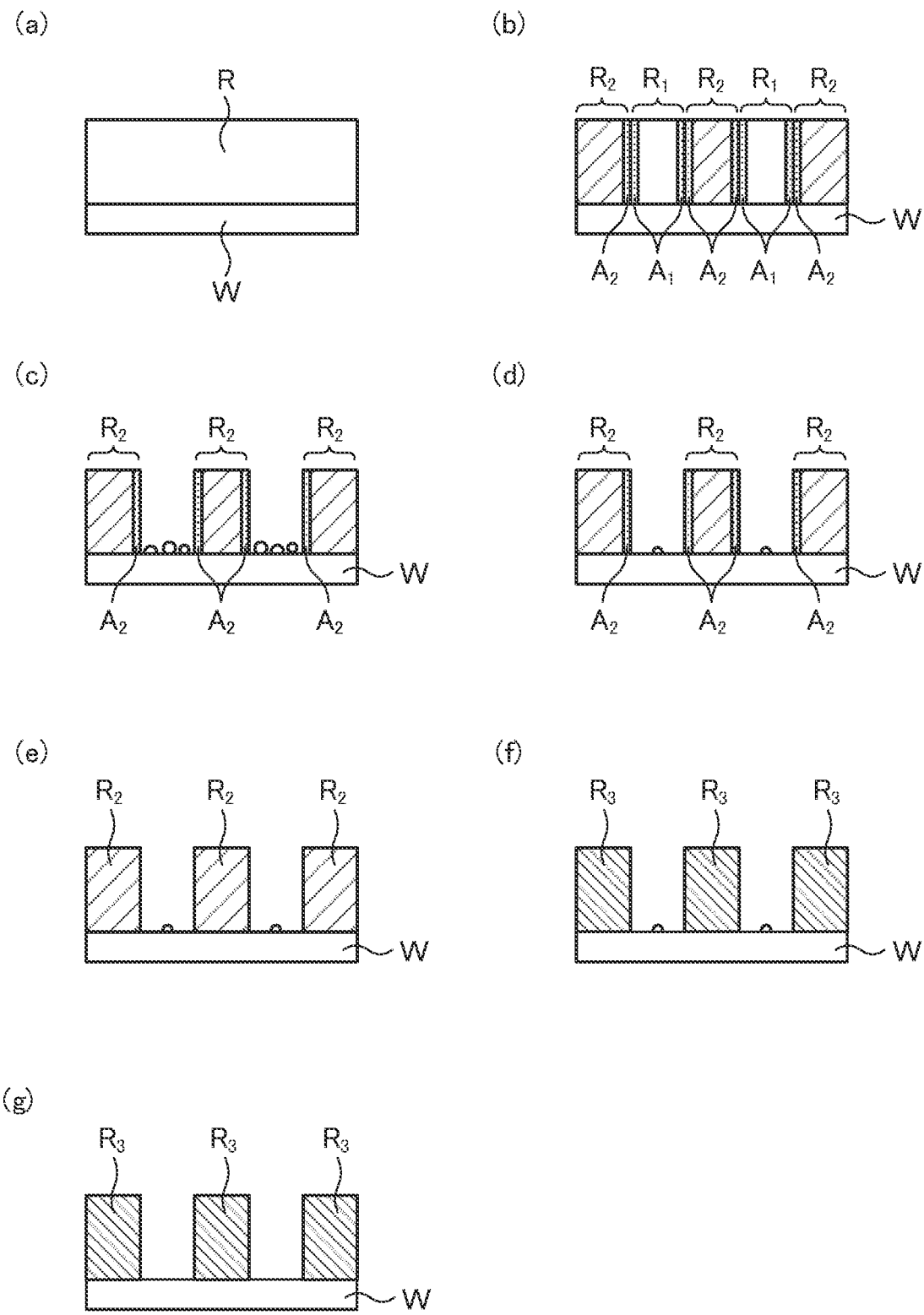
FIG. 8 is an explanatory view illustrating a state of a metal-containing coating film on a substrate in a developing method according to the embodiment.

For performing the developing treatment on the wafer W, first, a metal-containing resist film R is formed on the front surface of the wafer W in the resist coating apparatus 31 (FIG. 8(a)).

Then, the wafer W is subjected to edge exposure processing in the edge exposure apparatus 41, exposure processing in the exposure apparatus 12, and a PEB treatment in the thermal treatment apparatus 40, and is brought into a state where not-exposed resist films $R_1$ and exposed resist films $R_2$ exist on the front surface of the wafer W (FIG. 8(b)). In this event, the resist films $R_2$ at the exposed portions are in a state where a polymerization reaction has proceeded as a whole, and the resist films $R_1$ at the unexposed portions are in a state where the polymerization reaction has not proceeded as a whole.

Figure 9:
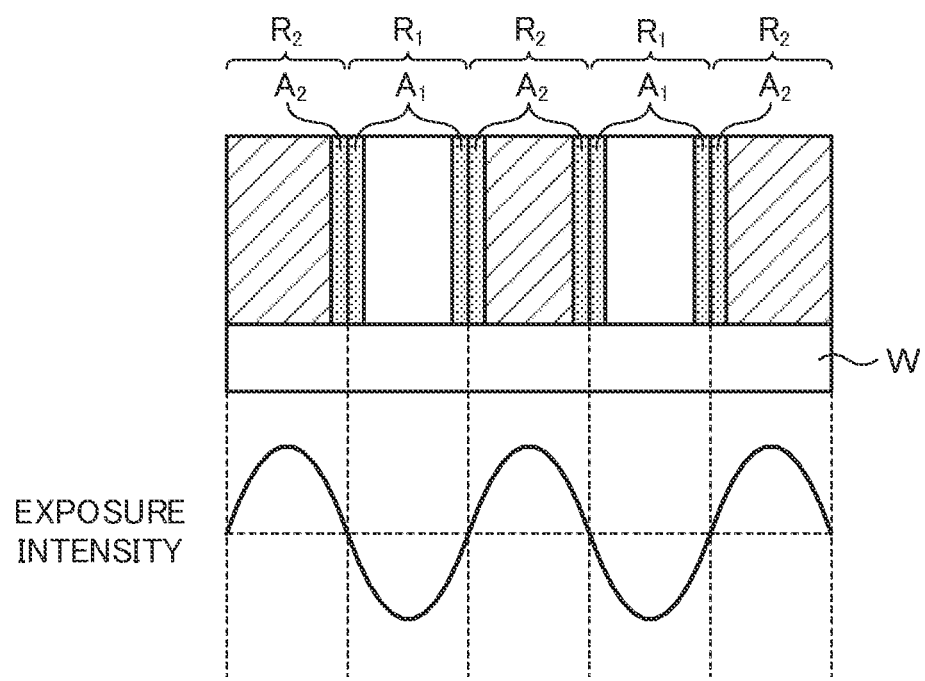
FIG. 9 is an explanatory view illustrating states of the metal-containing coating films at exposed portions and at unexposed portions.

Note that during the exposure processing of the resist film R, the exposure is performed in a state where the exposure intensity periodically changes as in FIG. 9 in terms of characteristics of an exposure apparatus. In more detail, the exposure intensity is low at an extent at which the polymerization reaction does not proceed at a middle portion in the horizontal direction of the resist film $R_1$ at the unexposed portion, whereas the exposure intensity is higher in the vicinity of a boundary with the resist film $R_2$ at the exposed portion than that at the middle portion. Therefore, a region $A_1$ where the polymerization reaction has proceeded though it is the unexposed portion, exists in the resist film $R_1$ at the unexposed portion in the vicinity of the boundary with the resist film $R_2$ at the exposed portion.

Further, the exposure intensity is high at an extent at which the polymerization reaction sufficiently proceeds at the middle portion in the horizontal direction of the resist film $R_2$ at the exposed portion, whereas the exposure intensity is lower in the vicinity of the boundary with the resist film $R_1$ at the unexposed portion than that at the middle portion. Therefore, a region $A_2$ where the polymerization reaction has proceeded less than at the middle portion of the resist film $R_2$ at the exposed portion, exists in the resist film $R_2$ at the exposed portion in the vicinity of the boundary with the resist film $R_1$ at the unexposed portion.

Subsequently, the wafer W exposed into a predetermined pattern is transferred to the developing solution supply apparatus 30, in which the developing solution is supplied to the front surface of the wafer W. The developing solution supplied here contains an organic solvent. Thus, the resist films $R_1$ at the unexposed portions formed on the front surface of the wafer W are dissolved (FIG. 8(c)). As for the developing solution containing the organic solvent, the kind of a treatment solution is not particularly limited as long as it is a treatment solution which does not dissolve the resist films $R_2$ at the exposed portions. Besides, the developing solution may be a mixed solution of two or more kinds of organic solvents. For example, 2-heptanone or a mixed solution of PGMEA (propylene glycol monomethyl ether acetate) and an acetic acid may be employed as the developing solution.

Most of the resist dissolved in the developing solution is removed from the front surface of the wafer W together with the drainage of the developing solution, but a resist dissolved material which has not completely dissolved in the developing solution may remain as a residue on the front surface of the wafer W. In particular, the regions $A_1$ where the polymerization reaction has proceeded exist in the resist films $R_1$ at the unexposed portions illustrated in FIG. 8(b), and the regions $A_1$ are in a state of being less likely to dissolve in the organic solvent than the other region of the resist films $R_1$ at the unexposed portions. Therefore, the resist films $R_1$ do not completely dissolve but the resist dissolved material is likely to remain on the front surface of the wafer W at the regions $A_1$.

Next, the cleaning solution is supplied to the wafer W on which the resist dissolved material remains. The cleaning solution supplied here contains an organic solvent as in the developing solution. Therefore, due to contact of the cleaning solution with the resist dissolved material, the resist dissolved material starts to dissolve. Then, the resist dissolved material completely dissolved in the cleaning solution is removed from the front surface of the wafer W together with the waste of the cleaning solution (FIG. 8(d)). This reduces the amount of the resist dissolved material remaining as a residue on the front surface of the wafer W.

In the above step of supplying the cleaning solution to the wafer W, a treatment solution lower in solubility of the metal-containing resist film R than the developing solution is used as the cleaning solution in order to avoid the dissolution of the pattern. The "solubility of the metal-containing resist film R" of the developing solution or the cleaning solution here is an index indicating the ease of dissolution of the metal-containing resist film R in the developing solution or the cleaning solution. For example, when supplying the same amount of two kinds of treatment solutions to the resist film R, a treatment solution lower in dissolution amount (reduction amount of volume) of the resist film R per unit time of the two kinds of treatment solutions is the treatment solution relatively low in solubility of the metal-containing resist film R.

Generally, the developing solution has solubility at an extent at which the resist film $R_2$ at the exposed portion does not dissolve, but if a cleaning solution higher in solubility than that of the developing solution is used, the resist film $R_2$ at the exposed portion dissolves and the pattern shape possibly collapses. Further, in the region $A_2$ existing in the resist film $R_2$ at the exposed portion, the polymerization reaction has proceeded less than at the other region in the resist film $R_2$ at the exposed portion, and therefore the region $A_2$ is in a state of being likely to dissolve in the organic solvent. Therefore, if the solubility of the resist film R is the same between the cleaning solution and the developing solution, the region $A_2$ slightly dissolves and possibly causes the collapse of the pattern shape. Accordingly, use of the treatment solution lower in solubility of the resist film R than the developing solution as the cleaning solution can dissolve the resist dissolved material remaining on the front surface of the wafer W without collapsing the pattern.

As for the cleaning solution containing the organic solvent, the kind of the treatment solution is not particularly limited as long as it is a treatment solution which is lower in solubility of the resist film R than the developing solution. Besides, the cleaning solution may be a mixed solution of two or more kinds of organic solvents. For example, in the case where the developing solution is 2-heptanone, a treatment solution such as MIBC (methyl isobutyl carbinol) or PGMEA (propylene glycol monomethyl ether acetate) may be employed as the cleaning solution. Besides, in the case where the developing solution is a mixed solution of PGMEA and an acetic acid, a treatment solution such as 2-heptanone, MIBC, PGMEA, PGME (propylene glycol monomethyl ether), a mixed solution of PGMEA and PGME, nBA (n-butyl acetate), IPA (isopropyl alcohol) may be employed as the cleaning solution. Note that in this embodiment, the cleaning solution nozzle 130 is provided in the developing solution supply apparatus 30, and therefore the supply of the cleaning solution subsequent to the supply of the developing solution is performed in the developing solution supply apparatus 30, but the wafer W may be transferred, for example, to the cleaning solution supply apparatus 32 and subjected to the supply of the cleaning solution.

The developing method according to this embodiment performs a step of supplying the developing solution to the above wafer W and a step of supplying the cleaning solution to the wafer W, and thereby can reduce the amount of the resist dissolved material remaining as a residue on the front surface of the wafer W and form a predetermined pattern on the wafer W.

Depending on the kinds of the metal-containing resist solution, the developing solution, and the cleaning solution and the treatment condition, the resist dissolved material remaining on the front surface of the wafer W may be removed to an extent at which the required quality is satisfied at a stage where the step of supplying the cleaning solution to the wafer W is completed illustrated in FIG. 8(d). In this case, at the step of supplying the cleaning solution to the wafer W illustrated in FIG. 8(d), the series of developing step of forming the resist pattern is completed.

On the other hand, in order to further reduce the amount of the residue remaining on the front surface of the wafer W after the step of supplying the cleaning solution to the wafer W, the following step is performed as needed.

First, the wafer W cleaned with the cleaning solution is transferred to the ultraviolet irradiation apparatus 42, in which the front surface of the wafer W is irradiated with the ultraviolet light having a wavelength of 190 to 400 nm. At this step, for example, KrF exposure of a wavelength of 248 nm is performed. At the irradiation with the ultraviolet light, no mask is used, the entire wafer W is uniformly irradiated with the ultraviolet light. Thus, the exposure reaction of the entire resist films $R_2$ at the exposed portions further proceeds, so that the exposure reaction proceeds, similarly in the other regions, in the regions $A_2$ where the exposure reaction has not relatively proceeded in the resist films $R_2$ (FIG. 8(e)). Note that when the wavelength of the ultraviolet light is shorter than 190 nm, a reaction of cutting a C—O bonding of the resist films $R_2$ occurs due to the irradiation with the ultraviolet light but the exposure reaction of the resist films $R_2$ does not occur. Further, in this embodiment, the irradiation with the ultraviolet light is performed in the ultraviolet irradiation apparatus 42 but may be performed, for example, in the exposure apparatus 12.

Next, the wafer W irradiated with the ultraviolet light is transferred to the thermal treatment apparatus 40 and heated. This further promotes the polymerization reaction of the resist films $R_2$ which have been entirely and sufficiently exposed, and the resist films $R_2$ harden and thereby change in quality into strong resist films $R_3$ (FIG. 8(f)). Note that in this embodiment, the heating of the wafer W after the ultraviolet light irradiation is performed in the thermal treatment apparatus 40, but the wafer W may be heated, for example, in the ultraviolet irradiation apparatus 42 when the ultraviolet irradiation apparatus 42 has a heating mechanism for the wafer W. Besides, when the irradiation with the ultraviolet light and the heating of the wafer W are possible in the same module, the heating of the wafer W may be performed during the irradiation with the ultraviolet light or may be performed after the irradiation with the ultraviolet light.

Next, the heated water W is transferred to the cleaning solution supply apparatus 32, in which the cleaning solution is supplied to the front surface of the wafer W. Note that the "cleaning solution" supplied here is described as a "pattern cleaning solution" in the following explanation in convenience in order to discriminate it from the cleaning solution supplied at the step illustrated in FIG. 8(d). The pattern cleaning solution contains an organic solvent, so that due to contact of the pattern cleaning solution with the resist dissolved material remaining on the front surface of the wafer W, the resist dissolved material dissolves (FIG. 8(g)).

Since the resist films $R_3$ hardened through the irradiation with the ultraviolet and the heat treatment are unlikely to dissolve in the organic solution, it is also possible to use a treatment solution higher in solubility of the resist film R than the cleaning solution used before the irradiation with the ultraviolet light as the pattern cleaning solution. Therefore, it is possible to dissolve the resist dissolved material which has not been completely removed in the cleaning step of the wafer W illustrated in FIG. 8(d). The resist dissolved material dissolved in the pattern cleaning solution is removed from the front surface of the wafer W together with the drainage of the pattern cleaning solution. This can further reduce the amount of the resist dissolved material remaining as a residue on the front surface of the wafer W.

The pattern cleaning solution containing the organic solvent is not particularly limited as long as it is a treatment solution which does not dissolve the hardened resist films $R_3$. Besides, the pattern cleaning solution may be a mixed solution of two or more kinds of organic solvents. For example, an alkaline treatment solution such as a treatment solution containing TMAH (tetramethylammonium hydroxide) may be employed as the pattern cleaning solution. As an example, a TMAH solution having a mass percent concentration of 2.38% may be employed as the pattern cleaning solution. Further, a treatment solution containing, for example, an organic acid such as acetic acid, formic acid, or citric acid may be employed as the pattern cleaning solution. Besides, the hardened resist films $R_3$ are less likely to dissolve in the organic solvent than the resist films $R_2$ before the irradiation with the ultraviolet light, so that it is also possible to select a treatment solution higher in solubility of the resist film R than the developing solution, as the pattern cleaning solution.

Note that in this embodiment, the supply of the pattern cleaning solution is performed in the cleaning solution supply apparatus 32, but the supply of the pattern cleaning solution to the wafer W may be performed in the developing solution supply apparatus 30 in the case where the developing solution supply apparatus 30 has a function of supplying the pattern cleaning solution.

The wafer W for which the cleaning with the pattern cleaning solution has been finished is subjected to cleaning with pure water and drying, with which a series of developing step is completed.

As explained above, it is possible to further reduce the amount of the resist dissolved material remaining as a residue on the front surface of the wafer W by irradiating the wafer W after the supply of the developing solution with the ultraviolet light having a wavelength of 190 to 400 nm, then heating the wafer W, and thereafter supplying the pattern cleaning solution to the wafer W.

The embodiments disclosed herein are examples in all respects and should not be considered to be restrictive.

Various omissions, substitutions and changes may be made in the embodiments without departing from the scope and spirit of the attached claims.

Note that the developing method for a substrate according to this disclosure is also applicable to a developing method for a treatment object substrate other than the semiconductor wafer, for example, FPD (flat panel display) substrate.

According to this disclosure, it is possible to reduce the amount of a residue on a front surface of a substrate generated in a developing treatment of a metal-containing coating film.

What is claimed is:

1. A developing method of performing a developing treatment on a substrate, the developing method comprising:
   supplying a developing solution containing an organic solvent to the substrate having a metal-containing coating film exposed into a predetermined pattern;
   supplying a cleaning solution containing an organic solvent to the substrate supplied with the developing solution;
   irradiating the substrate supplied with the cleaning solution with ultraviolet light having a wavelength of 190 to 400 nm;
   heating the substrate during or after the irradiation with the ultraviolet light; and
   supplying a pattern cleaning solution containing an organic solvent to the heated substrate, wherein
   the cleaning solution is lower in solubility of the metal-containing coating film than the developing solution.

2. The developing method according to claim 1, wherein at least one of the developing solution and the cleaning solution is a mixed solution of two or more kinds of organic solvents.

3. The developing method according to claim 1, wherein the developing solution is 2-heptanone.

4. The developing method according to claim 3, wherein the cleaning solution is methyl isobutyl carbinol or propylene glycol monomethyl ether acetate.

5. The developing method according to claim 1, wherein the developing solution is a mixed solution of propylene glycol monomethyl ether acetate and an acetic acid.

6. The developing method according to claim 5, wherein the cleaning solution is a treatment solution selected from a group consisting of 2-heptanone, methyl isobutyl carbinol, propylene glycol monomethyl ether acetate, propylene glycol monomethyl ether, a mixed solution of propylene glycol monomethyl ether acetate and propylene glycol monomethyl ether, n-butyl acetate, and isopropyl alcohol.

7. The developing method according to claim 1, wherein the pattern cleaning solution is a treatment solution containing an alkaline treatment solution or an organic acid.

8. The developing method according to claim 1, further comprising
   after a cleaning of the substrate with the pattern cleaning solution is finished, performing a cleaning of the substrate with pure water and a drying of the substrate.

* * * * *